United States Patent [19]

Kaplinsky

[11] Patent Number: 5,023,606
[45] Date of Patent: * Jun. 11, 1991

[54] PROGRAMMABLE LOGIC DEVICE WITH GANGED OUTPUT PINS

[75] Inventor: Cecil H. Kaplinsky, Palo Alto, Calif.

[73] Assignee: Plus Logic, Inc., San Jose, Calif.

[*] Notice: The portion of the term of this patent subsequent to Jul. 11, 2006 has been disclaimed.

[21] Appl. No.: 349,581

[22] Filed: May 9, 1989

Related U.S. Application Data

[63] Continuation-in-part of Ser. No. 143,619, Jan. 3, 1988, Pat. No. 4,847,612.

[51] Int. Cl.$^5$ .............................................. H04Q 1/00
[52] U.S. Cl. ................................ 340/825.8; 307/465; 340/825.83
[58] Field of Search ................ 307/465, 466, 468, 467, 307/469, 255, 259, 262, 253, 254, 239, 270; 340/825.79–825.96; 379/306

[56] References Cited

U.S. PATENT DOCUMENTS

| | | |
|---|---|---|
| 4,034,356 | 7/1977 | Howley et al. |
| 4,124,899 | 11/1978 | Birkner et al. ........................ 364/716 |
| 4,207,556 | 6/1980 | Sugiyama et al. ................... 340/166 |
| 4,314,349 | 2/1982 | Batcher ............................... 364/716 |
| 4,414,547 | 11/1983 | Knapp et al. ...................... 340/825.83 |
| 4,422,072 | 12/1983 | Cavlan ............................. 340/825.87 |
| 4,431,928 | 2/1984 | Skokan .................................. 307/465 |
| 4,609,986 | 9/1986 | Hartmann et al. ................... 364/200 |
| 4,642,487 | 2/1987 | Carter ................................... 307/465 |
| 4,670,749 | 6/1987 | Freeman ........................... 340/825.85 |
| 4,763,020 | 8/1988 | Takata et al. ......................... 307/465 |
| 4,847,612 | 7/1989 | Kaplinsky ........................... 340/825.8 |

FOREIGN PATENT DOCUMENTS 0219221 4/1987 European Pat. Off. .

OTHER PUBLICATIONS

Pardner Wynn, "Designing with Logic Cell Arrays", *Electro/87 and Mini/Micro Northeast, Conference Record*, vol. 12, 1987, pp. 1–9, see especially pp. 4 and 5.
Ikawa et al., "A One-Day Chip; An Innovative IC Construction Approach...", IEEE Journal of Solid-State Circuits, vol. SC-21, No. 2, Apr. 1986, pp. 223–227.
"Technology to Watch: Programmable Logic Devices", *Electronics*, Sep. 17, 1987, pp. 65–72.
P. Robinson, "Overview of Programmable Hardware", *BYTE*, Jan. 1987, pp. 197–203.
V. Coli, "Introduction to Programmable Array Logic", *BYTE*, Jan. 1987, pp. 207–219.

*Primary Examiner*—Ulysses Weldon
*Attorney, Agent, or Firm*—Schneck & McHugh

[57] ABSTRACT

A programmable logic device architecture having a matrix of smaller functional units, each of which being a programmable logic array, and a set of fixed conductive lines connected to the functional unit inputs and outputs, the conductive lines forming programmable interconnection matrices. The input pins can be programmably connected to any input of any functional unit, and the outputs of functional units can be programmably connected to any input of any functional unit. Output pins connect directly to outputs of functional units. The interconnection matrices may be a simple array of crossing conductive lines with crossings connected by EPROM, or EEPROM switches.

10 Claims, 3 Drawing Sheets

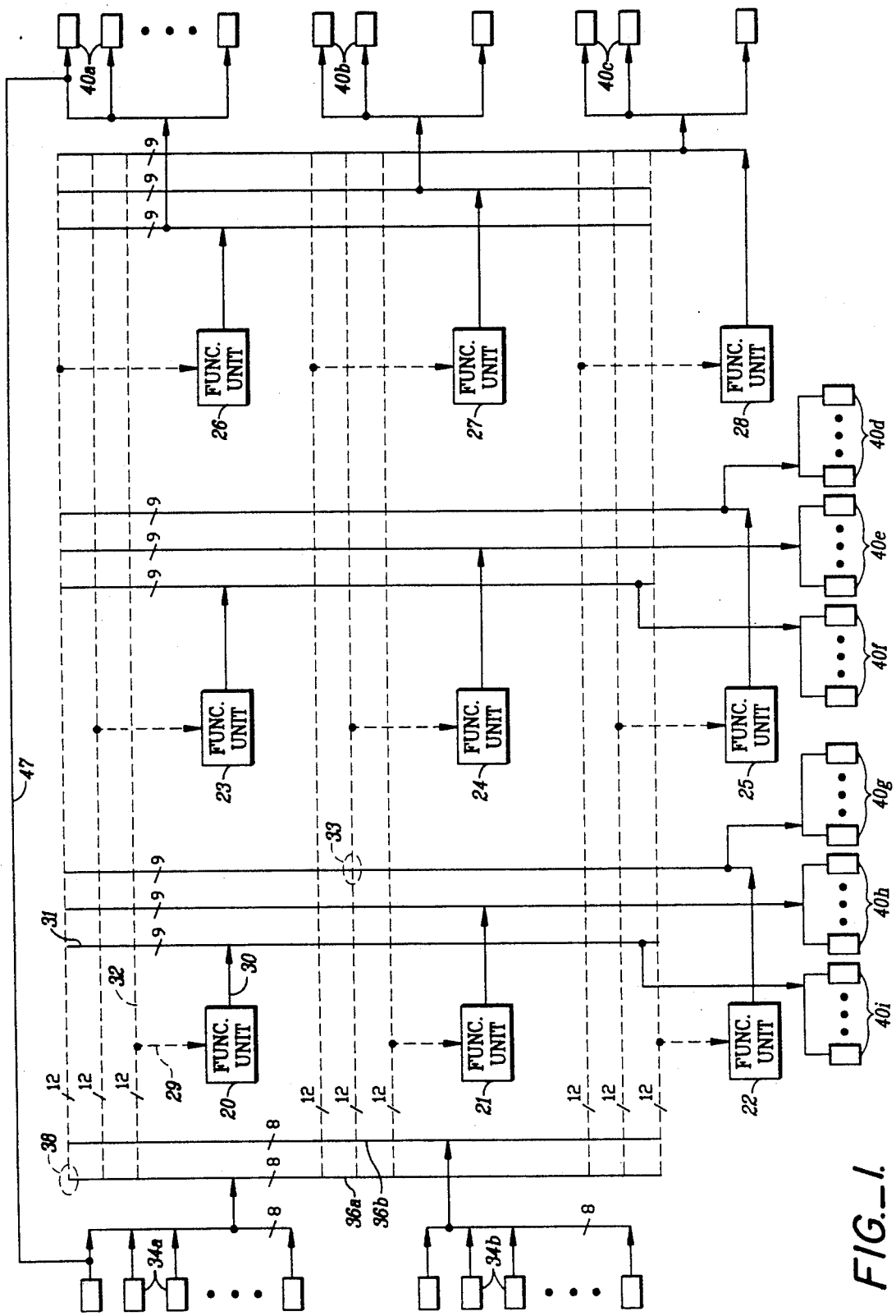
FIG._1.

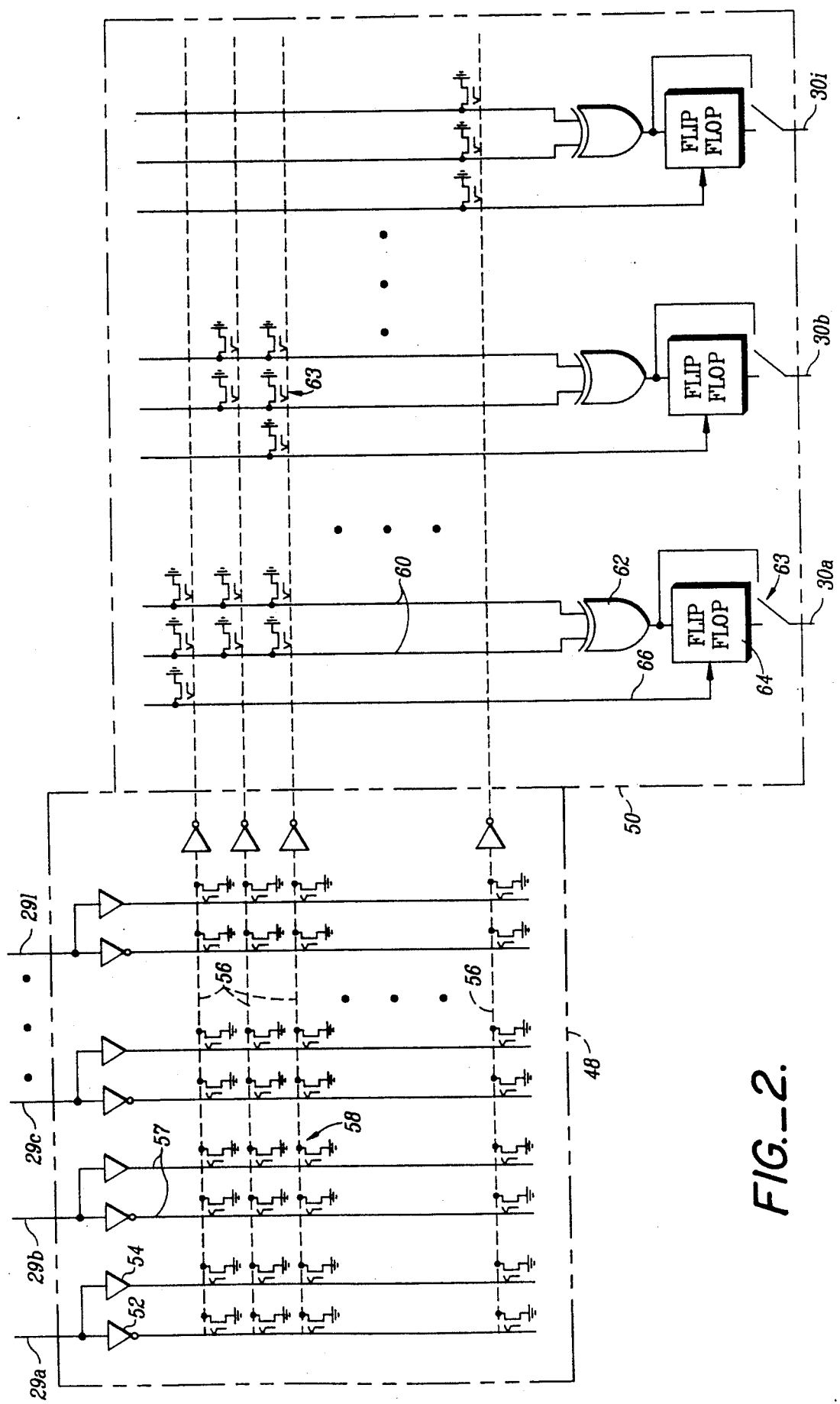
FIG._2.

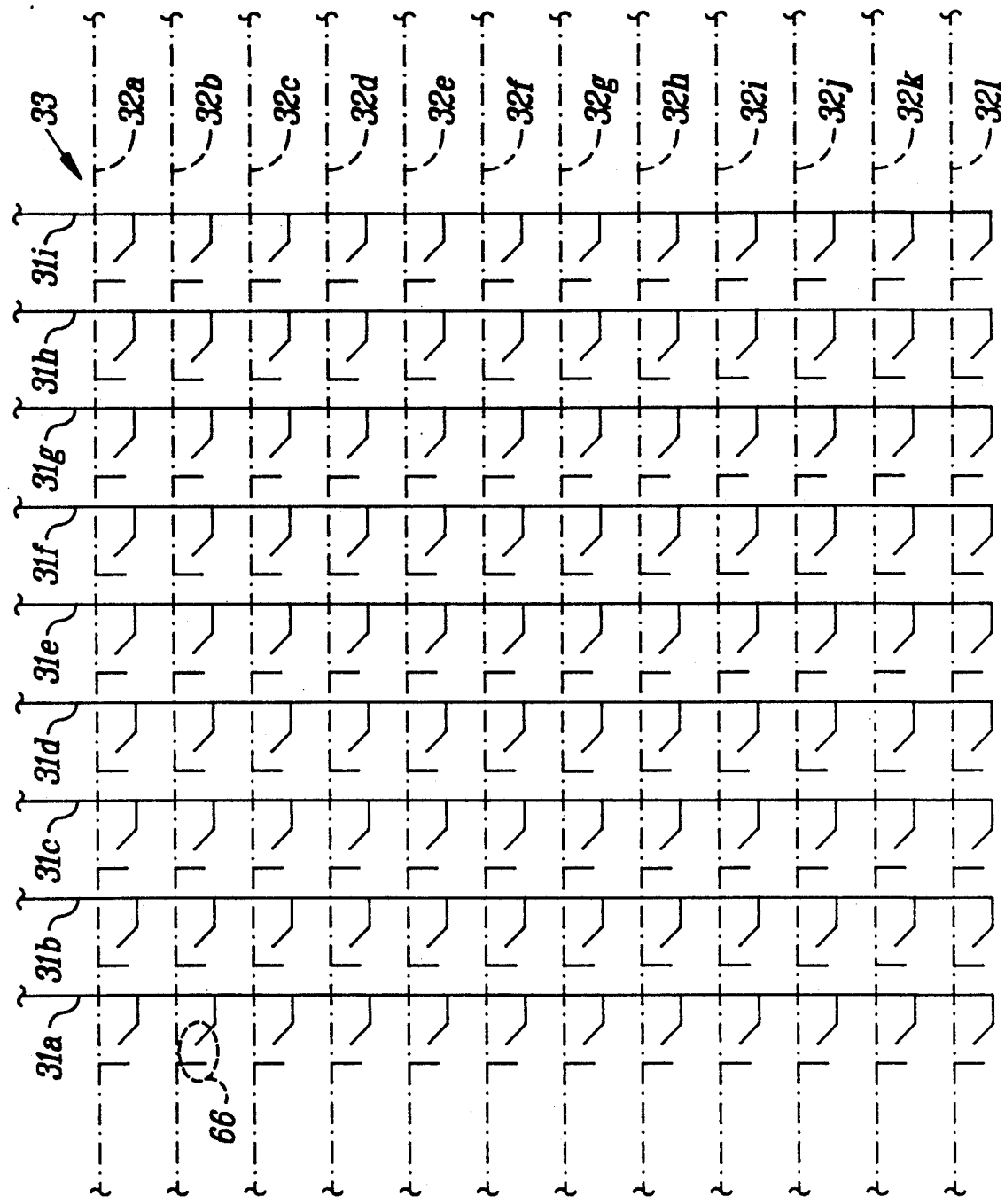
FIG._3.

PROGRAMMABLE LOGIC DEVICE WITH GANGED OUTPUT PINS

CROSS REFERENCE TO RELATED APPLICATION

This is a continuation-in-part of application Ser. No. 143,619, filed Jan. 13, 1988 now U.S. Pat. No. 4,847,612.

TECHNICAL FIELD

The present invention relates to a class of integrated circuits known as programmable logic devices, whether mask programmable, fusible, ultraviolet erasable reprogrammable or electrically erasable reprogrammable, and in particular to architectures for programmable logic devices for optimizing speed and functional flexibility.

BACKGROUND ART

Programmable logic devices (PLDs) are integrated circuits which increasingly are being used to provide the logic for electronic systems. For example, these devices may be used as "glue" to electrically connect and control the interaction of the major parts of a microcomputer system. Typically, PLDs include a set of input pins, two arrays of logic gates, i.e. an AND array followed by an OR array, and a set of output pins. Frequently, flip-flops following the OR array together with feedback lines are also included in order to provide registered output and sequential logic capabilities instead of the combinatorial logic provided by the AND-/OR arrays alone.

Presently, several basic types of PLD architectures are available. In programmable logic elements (PLEs), the AND array is fixed and the OR array is programmable. PLEs are useful in applications requiring most or all possible input combinations, such as lookup tables and character generators. However, because the array size must be doubled for each additional input, PLEs are limited by cost and performance constraints to a small number of inputs. Programmable logic arrays (PLAs) have both a programmable AND array and a programmable OR array. Programmable array logic (PAL) devices have a programmable AND array, but a fixed OR array. Both the PLA and PAL architectures have advantages. Because both arrays are programmable, PLAs offer a high degree of functional flexibility. However, PALs are faster, because a programmable OR array is slower than dedicated OR gates. The PLA's flexibility is useful for complex state-machine and sequence applications, while most other applications not requiring a high degree of flexibility take advantage of the PAL's speed.

Some attempts have been made to combine both functional flexibility and speed in a PLD architecture. In Monolithic Memories' series of MEGAPALS, the size of the AND array was increased and a fixed number of AND product terms were allowed to be shared amongst two outputs. Altera's EP1200 chip is segmented into "sub-PALs" with only four outputs, the outputs of a particular segment being usable as inputs for only some of the sub-PALs. In each case, all of the inputs are available to all of the AND terms simultaneously, resulting in AND arrays with 64 inputs, most of which remaining unused for any given product term. Because of their fixed product terms, there are 16 product terms per OR gate. In practice, few sets of logic need so many inputs to an OR gate.

In U.S. Pat. No. 4,207,556, Sugiyama et al. discloses a programmable logic array arrangement having a plurality of cell units, each comprising a plurality of electronic elements, such as resistors, diodes and transistors, a wiring matrix of row and column lines, and an array unit having a group of switching elements for selectively interconnecting the various row and column lines, and electronic elements. The arrangement sacrifices density and speed for functionality by including a large number of electronic elements with variable wiring in each unit.

In Ikawa et al., "A One Day Chip: An Innovative IC Construction Approach . . . ", *IEEE Journal of Solid-State Circuits*, vol. Sc-21, No. 2, April 1986, pp. 223-227, a VLSI chip contains 50-200 standard logic functional blocks of SSI/MSI level integration performing various kinds of functions, such as inverters, NORs, NANDs, flip-flops, shift registers, counters, multipliers, ALUs, etc. Each of these fixed functional units may be connected to other functional units by means of an EEPROM switch matrix. The switch matrix provides flexibility and can easily be reprogrammed, but a large number of standard functional blocks must be anticipated to provide true flexibility, most of which would be unused for any given chip function.

An object of the present invention is to provide a programmable logic device architecture which makes good use of chip area, and combines functional flexibility with speed.

DISCLOSURE OF THE INVENTION

The above objects have been met with a programmable logic device having a plurality of programmable functional units, each of which is similar to a PLA. Two fixed sets of conductive lines, one set permanently connected to the outputs of functional units, the other set permanently connected to the inputs of functional units, form programmable interconnection matrices where the two sets of conductive lines cross. Further, any of the input pins can be programmed to connect to any input of any functional unit. Each of the output pins is directly connected or ganged to an output of a functional unit.

Each interconnection matrix selectively connects the lines for each output of a functional unit to the lines for each input of the same or other functional unit. Typically, lines are connected by closing a switch, such as an EPROM or EEPROM. Each functional unit may be configured like a conventional PLA with a number of inputs and outputs, AND OR arrays, and possibly feedback lines, dedicated units and registers, edge triggered or enabled by a level. The OR array may be only partially populated with programming links. Some of the functional units can be PALs, an EPROM memory, a discrete-logic comparator and the like.

BRIEF DESCRIPTION OF THE DRAWINGS

FIG. 1 is a schematic showing the basic structure of a programmable logic device of the present invention.

FIG. 2 is a schematic of a functional unit in the device of FIG. 1.

FIG. 3 is a schematic of an interconnection matrix in the device of FIG. 1.

BEST MODE FOR CARRYING OUT THE INVENTION

With reference to FIG. 1, a programmable logic device includes a plurality of functional units 20-28. Preferably, the functional units 20-28 are arranged in a matrix of rows and columns. In the example given in FIG. 1, 9 functional units are shown, but the actual number may vary from device to device. Each functional unit includes a set of inputs 29 and a set of outputs 30. In the example in FIG. 1, each functional unit 20-28 has 12 inputs and 9 outputs. However, the number of inputs and outputs from the functional units may vary from device to device or within a device from functional unit to functional unit. Each functional unit performs one or more logic functions which when combined with logic functions from itself and other functional units produces the more complex function of the overall programmable logic device.

The programmable logic device also includes a first set of conductive lines, represented by the vertical lines 31 of multiplicity 9, which are permanently connected to the outputs 30 of functional units 20-28. Similarly, the device includes a second set of conductive lines, represented by the horizontal dashed lines 32 of multiplicity 12, which are permanently connected to the input lines 29 of functional units 20-28. Since each of the conductive lines either of the first set 31 or of the second set 32, is connected to the outputs or inputs of a particular functional unit, the multiplicity of these lines exactly matches the number of inputs or outputs of each functional unit. By the term "multiplicity" we mean that each of the lines and dashed lines represented in FIG. 1 is in actuality a collection of conductive lines whose number is indicated by the multiplicity. Thus the vertical solid line indicated by reference numeral 31 actually represents 9 conductive lines, each of which is connected to an output line 30 from functional unit 20. Likewise the horizontal dashed line indicated by reference numeral 32 is in actuality 12 conductive lines each permanently connected to an input 29 of functional unit 20. The actual multiplicity of each of the lines will depend on the number of inputs and outputs for each functional unit 20-28.

The two sets of conductive lines 31 and 32 cross at various areas of the programmable logic device to form programmable interconnection matrices 33. In the example given in FIG. 1, since one set of lines has a multiplicity of 9 and the other set of lines has a multiplicity of 12 the intersection of these two sets of lines forms matrices with 12×9 or 108 programmable crossings. Each of the crossings may be programmed to conduct or not conduct from one line to another by switches from one of a number of technologies. For example, each crossing into an interconnection matrix may be mask programmed at a Fab facility in accordance with a user's instructions by forming VIAs between two levels of crossing lines. Alternatively the interconnection matrices may be field programmable by providing conductive fuses which may be broken by a user. Preferably, however, the interconnection matrices are field programmable and erasable by providing EPROM or EEPROM switch transistors.

The programmable logic device also includes a set of input pins 34a and 34b. By "pins", we mean not only DIP-type pins but also other input and output constructions known in the art, such as the metallized contacts of flat chip carriers. In the example in FIG. 1, 16 input pins are provided However, the number of input pins may vary from device to device. The sets of input pins 34a and 34b are permanently connected to conductive input lines 36a and 36b disposed to cross the second set of conductive lines 32. The crossings of input lines 36a and 36b with conductive lines 32 form programmable interconnection matrices 38. In FIG. 1, each of the interconnection matrices 38 is a 12 by 8 matrix of line crossings which may be made conductive by mask programming, fuse programming or switch programming with EPROMs or EEPROMs In this manner each of the input pins 34a and 34b is selectively connected to any of the inputs 29 of functional units 20-28.

The programmable logic device also includes sets of output pins 40a through 40h. The number of output pins in each set may vary from set to set and from device to device. However, any number from 4 to about 9 pins per set is typical. Each of the output pins 40a and 40b is directly connected to an output line 30 of a functional unit 20-28. Input and output pins need not be distinct, as represented by line 47 connecting the pair of pins 34a and 40a. Accordingly pins 40a are input/output pin.

With reference to FIG. 2, some or all of the functional units 20-28 in FIG. 1 may be programmable logic arrays. As is known in the art a programmable logic array includes a programmable AND array 48 and a programmable OR array 50. These two arrays 48 and 50 combine to provide a two-step combinatorial logic. The PLA has a plurality of input lines 29a, 29b . . . , 29l and a plurality of output lines 30a, 30b, . . . , 30i. In the present example, the number of input lines is 12 and the number of output lines is 9, but the actual number may vary from device to device and from functional unit to functional unit. The number of input and output lines is however considerably smaller than that of prior programmable logic devices using a single AND array and a single OR array for performing complex logic functions, since the programmable logic device architecture of the present invention breaks down the complex function into a number of simpler functions carried out by each programmable functional unit.

Each input line 29a-1 passes through a pair of gates 52 and 54 which provide complementary signals. Each horizontal dashed line represents an AND gate, called a "product line". Each product line 56 is selectively connected to AND gate inputs 57 through programmable links 58. Links 58 may be mask programmed, fuse programmable or switch programmable. Each of the product lines 56 intersects OR input lines 60 leading to EXOR gates 62. Each intersection of a product line 56 and an OR input line 60 forms a programmable link 63 which again may be mask programmed, fuse programmable or switch programmable.

In the functional unit in FIG. 2 the output from EXOR gates 62 may be either directly connected to output lines 30a-i or connected through a flip-flop 64, the selection being made with a switch 63. Flip-flop 64 is a D-type flip-flop whose clock signal is determined by one of the product lines 56 connected via clock line 66. D-type flip-flops are commonly used in programmable logic devices to provide registered outputs. Other types of flip-flops and latches may also be used as well as feedback lines to either the AND array 48 or to input lines 29a-1. While functional units are preferably of the programmable logic array type, with both programmable AND programmable OR arrays, they may also be of the other programmable logic device types with either fixed AND or fixed OR arrays.

OR arrays are useful because they allow two-stage logic to be used. PALs, with fixed ORs, also do this but at the expense of not being able to use product terms for multiple ORs. Product terms of PALs are committed to specific ORs and a product term not used in one AND-/OR function cannot be used in another which may need extra ORs. A fixed OR is however faster and thus PALs trade off function for speed. Programmable OR terms in PLAs are slow because of the capacitance of the switches.

In the OR array 50 of FIG. 2, the product lines 56 connect to subsets only of OR gate input lines 60. In other words, the input lines 60 are only partially populated with programmable links 63 to product lines 56. For example, a typical arrangement for an AND/OR array includes 12 AND input lines, 44 product terms, 27 OR gate input lines (including input lines to latches or flip-flops 64) and 9 output lines. The OR gate input lines are grouped into threes, with two lines leading to an EXOR gate 62 and the third line serving as a clock for latch 64. One possible arrangement of partially populated programmable links staggers the programmable links so that the first 12 product terms are connectable to the first group of three groups of three OR input lines, product terms 5–16 are connectable to the second group of OR input lines, product terms 9–20 are connectable to the third group of three groups of three OR input lines, and so forth, with the last 12 product terms 33–44 connectable to the ninth group of three groups of three OR input lines. Other partially populated arrangements of programmable links can also be constructed.

There are some frequently used arithmetic and logic functions which cannot easily or quickly be done with a small number of product terms using an AND/OR array. Addition and testing a result for zero are two examples. Consider, for example, the addition of two numbers A and B to obtain a sum S. The nth bit of the sum $S_n$ is $S_n = (A_n \cdot B_n \cdot OR \cdot A_n \cdot B_n) \cdot EXOR \cdot C_{n-1}$, where $C_{n-1} = A_{n-1} \cdot B_{n-1} \cdot OR \cdot A_{n-1} \cdot C_{n-2} \cdot OR \cdot B_{n-1} \cdot C_{n-2}$ is the carry in from a previous computation stage The carry term can be calculated sequentially, i.e. by a "ripple carry", by feeding the previous carry term back into the array. To help carry out this calculation without using up large numbers product terms or considerably slowing the functional unit, specialized units with dedicated logic may be included at the output of the sum terms. Such specialized units would only be used where needed and be programmably linked to the remainder of the AND/OR array by EPROM switches or the like.

Functional units 22–28 for providing complex control logic need not comprise only programmable logic arrays like that seen in FIG. 2. For example, an EPROM memory with a set of inputs for address, write and enable and the like, as well as a set of outputs for data, may be connected to the same sets of conductive lines 31 and 32 as other functional units Similarly, dedicated logic structures, such as an arithmetic logic unit with inputs for operands and operators, and outputs for operation results or a byte comparator circuit, may be connected in the same manner. Such an arrangement could, for example, integrate central processing units with their glue logic on the same chip. However, to prevent a reduction in device flexibility only a few of the functional units should be logic or memory circuits instead of PLAs or PALs.

FIG. 3 shows an interconnection matrix 33. Interconnection matrices 38 and 44 in FIG. 1 are of similar construction. Any of the first set of conductive lines 31, i.e., the conductive lines permanently connected to outputs 30 of functional units, shown in FIG. 3 as solid vertical lines 31a–i can be connected to any of the first set of conductive lines 32 i.e. those lines permanently connected to inputs 29 of functional units and shown as dashed horizontal lines 32a–1. Connection is made usually by closing a switch In some cases, for example with fuses, the switch is closed until it is explicitly opened while with other switches such as EPROMs and EEPROMs the switch is open until it is explicitly closed. One hundred and eight switches 66 are shown in FIG. 3. The number of switches will vary from interconnection matrix to interconnection matrix, depending on the multiplicity of conductive lines 31 and 32.

The programmable logic device architecture of the present invention achieves a large amount of functional flexibility combined with high speed and low cost by providing individually programmable functional units, with a fixed set of wiring forming interconnection matrices which also can be individually programmed.

I claim:

1. A programmable logic device comprising,
    a plurality of functional units, each functional unit having a set of inputs and a set of outputs, each functional unit being individually programmable for carrying out one or more specified logic functions, each functional unit being a programmable logic device with an AND array and an OR array connected to the AND array,
    a first set of conductive lines, each line of said first set being permanently connected to an output from an OR array of one of said functional units,
    a second set of conductive lines, each line of said second set being permanently connected to an input to an AND array of one of said functional units,
    wherein said second set of conductive lines cross said first set of conductive lines, areas where said first and second sets of conductive lines cross forming at least one programmable interconnection matrix, said at least one matrix including programmable links at the intersections of each conductive line of the first set with a conductive line of the second set, each of said links being selectively openable and closable so as to connect any output of any functional unit to any input of any functional unit,
    a plurality of input pins, each input pin being selectively connectable to at least one conductive line of said second set, and
    a plurality of output pins, each output pin being permanently connected directly to one conductive line of said first set.

2. The device of claim 1 wherein said functional units comprise programmable logic arrays, both said AND arrays and said OR arrays of said functional units being programmable.

3. The device of claim 1 wherein said programmable logic devices further include registers programmably connected between said OR array and said set of outputs.

4. The device of claim 1 wherein said functional units and said interconnective matrices are switch programmable and erasable.

5. The device of claim 1 wherein said OR array is connected to said AND array via product lines leading from said AND array, said product lines being connectable to subsets of OR gate input lines of said programmable OR array.

6. The device of claim 1 wherein said plurality of functional units are arranged as a matrix of functional units.

7. A programmable logic device comprising,
   a plurality of functional units, each functional unit being programmable to perform a portion of an overall logic function, each functional unit having a set of inputs, an AND array connected to said set of inputs, an OR array connected to said AND array, and a set of outputs connected to said OR array,
   a matrix of conductive lines, said conductive lines including a first and second set of lines which cross one another at programmable interconnection points, each interconnection point having a selectively openable and closable link so as to connect a line of said first set to a line of said second set, each line of said first set being permanently connected to an output of one of said functional units, each line of said second set being permanently connected to an input of one of said functional units, whereby said plurality of functional units are programmably connectable to one another through said interconnection points to combine said portions of said overall logic function,
   a plurality of input pins, each input pin being selectively connectable to at least one conductive line of said second set, and
   a plurality of output pins, groups of said output pins being ganged to said sets of outputs of said functional units.

8. The device of claim 7 wherein both of said AND OR arrays in said functional units are programmable.

9. The device of claim 7 wherein said functional units and said links at each interconnection point of said matrix are switch programmable and erasable.

10. The device of claim 7 wherein said OR arrays in said functional units are only partially populated with programmable links.

* * * * *

UNITED STATES PATENT AND TRADEMARK OFFICE
CERTIFICATE OF CORRECTION

PATENT NO. : 5,023,606

DATED : June 11, 1991

INVENTOR(S) : Cecil H. Kaplinsky

It is certified that error appears in the above-identified patent and that said Letters Patent is hereby corrected as shown below:

Column 1, line 51, "state.-machine" should read
 - - state-machine - -

Column 2, line 54, "AND OR arrays" should read
 - - AND and OR arrays - -.

Column 4, line 1, "are provided However" should read
 - - are provided. However - -; line 11, "EPROMs In this manner" should read - - EEPROMs. In this manner - -;
 line 66, "AND programmable OR arrays," should read
 - - AND and programmable OR arrays - -.

Column 5, line 40, "computation stage The" should read
 - - computation stage. The - -; line 56, "functional units Similarly" should read - - functional units. Similarly - -.

Column 6, line 7, "a switch In" should read - - a switch. In - -.

Claim 8, column 8, lines 12-13, "said AND OR arrays" should read
--said AND and OR arrays--.

Signed and Sealed this

Tenth Day of November, 1992

*Attest:*

DOUGLAS B. COMER

*Attesting Officer*  *Acting Commissioner of Patents and Trademarks*